(12) United States Patent
Choi et al.

(10) Patent No.: US 9,977,296 B2
(45) Date of Patent: May 22, 2018

(54) LCD DEVICE INCLUDING COUPLING CAPACITOR AND METHOD OF MANUFACTURING THE SAME

(71) Applicant: Samsung Display Co., Ltd., Yongin-si (KR)

(72) Inventors: Nakcho Choi, Yongin-si (KR); Seiyong Park, Yongin-si (KR); Joonggun Chong, Yongin-si (KR); Changok Kim, Yongin-si (KR); Injae Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 14/988,422

(22) Filed: Jan. 5, 2016

(65) Prior Publication Data
US 2016/0377931 A1 Dec. 29, 2016

(30) Foreign Application Priority Data
Jun. 29, 2015 (KR) .................. 10-2015-0092029

(51) Int. Cl.
*G02F 1/1343* (2006.01)
*H01L 27/12* (2006.01)

(52) U.S. Cl.
CPC .... *G02F 1/134309* (2013.01); *G02F 1/13439* (2013.01); *H01L 27/1262* (2013.01);
(Continued)

(58) Field of Classification Search
CPC combination set(s) only.
See application file for complete search history.

(56) References Cited

U.S. PATENT DOCUMENTS

| 2003/0086041 | A1 | 5/2003 | Watanabe et al. |
| 2007/0002198 | A1* | 1/2007 | Yang ................. G02F 1/136286 349/43 |

(Continued)

FOREIGN PATENT DOCUMENTS

| KR | 10-2008-0046873 | 5/2008 |
| KR | 10-2009-0001226 | 1/2009 |
| KR | 10-2009-0100912 | 9/2009 |

*Primary Examiner* — Lauren Nguyen
(74) *Attorney, Agent, or Firm* — H.C. Park & Associates, PLC

(57) ABSTRACT

A liquid crystal display device includes a first substrate including an electrode structure layer defining a pixel and a switching device configured to switch the pixel, an opposite second substrate facing the first substrate and including a common electrode, and a liquid crystal layer disposed between the first and second substrates. The electrode structure layer includes a coupling electrode, a first pixel electrode, a second pixel electrode, and an insulating layer disposed between the coupling electrode and the second pixel electrode. An absolute value difference between a first product $R_pC_p$ of a resistance $R_p$ and a capacitance $C_p$ defined by the coupling electrode, the insulating layer, and the second pixel electrode, and a second product $R_2C_2$ of a resistance $R_2$ and a capacitance $C_2$ defined by the second pixel electrode, the liquid crystal layer, and the common electrode is less than or equal to 10.

9 Claims, 13 Drawing Sheets

(52) U.S. Cl.
CPC ......... *G02F 2001/134345* (2013.01); *G02F 2001/134354* (2013.01)

(56) References Cited

U.S. PATENT DOCUMENTS

| | | | |
|---|---|---|---|
| 2008/0278424 A1* | 11/2008 | Kim | G09G 3/3648 345/92 |
| 2009/0002583 A1 | 1/2009 | You et al. | |
| 2009/0237579 A1* | 9/2009 | Shin | G02F 1/1343 349/38 |
| 2013/0313530 A1* | 11/2013 | Seo | H01L 29/66969 257/40 |

\* cited by examiner

LCD DEVICE INCLUDING COUPLING CAPACITOR AND METHOD OF MANUFACTURING THE SAME

CROSS-REFERENCE TO RELATED APPLICATION

This application claims priority from and the benefit of Korean Patent Application No. 10-2015-0092029, filed on Jun. 29, 2015, which is hereby incorporated by reference for all purposes as if fully set forth herein.

BACKGROUND

Field

Exemplary embodiments relate to an LCD device and a method of manufacturing the same, and, more particularly, to an LCD device including a coupling capacitor and a method of manufacturing the same.

Discussion of the Background

A liquid crystal display (LCD) device may include two substrates including electric field-generating electrodes, such as a pixel electrode and a common electrode, and a liquid crystal (LC) layer disposed between the two substrates.

In an LCD device, transmittance of incident light may be adjusted by applying a voltage to the electric-field-generating electrodes, to generate an electric field in the LC layer, determine an alignment of LC molecules included in the LC layer, and control polarization of the incident light through the electric field. An LCD device may have a switching device that may control each pixel, and transmittance of light may be adjusted for each pixel according to an image signal, thereby displaying an image.

LCD devices may be classified into a vertically aligned mode LCD device, which may drive LC molecules by using an electric field formed in a vertical direction between substrates, and an in-plane switching mode LCD device, which may use a horizontal electric field that is parallel to substrates.

The vertically aligned mode LCD device may have high contrast ratio and wide viewing angles. Various LCD device driving methods have been suggested to improve lateral visibility of the vertically aligned mode LCD device, such as a patterned vertical alignment (PVA) mode, a multi-domain vertical alignment (MVA) mode, and a super-patterned vertical alignment (S-PVA).

In an S-PVA mode LCD device, each pixel electrode may include a main pixel electrode and a sub-pixel electrode, respectively applied with different voltages. S-PVA mode LCD devices may be classified into coupling capacitor (CC)-type LCD devices and two transistor (TT)-type LCD devices. In a CC-type LCD device driving method, a coupling capacitor may be formed between the main pixel electrode and the sub-pixel electrode. As such, a data voltage applied to the sub-pixel electrode may be dropped down, such that a voltage lower than a main pixel voltage may be applied to the sub-pixel, as a sub-pixel voltage. In a TT-type LCD device, a main pixel cell voltage and a sub-pixel cell voltage having different voltage levels from one another may be applied to a main pixel electrode and a sub-pixel electrode, respectively, by using two transistors.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a liquid crystal display (LCD) device and a method of manufacturing the same that includes a coupling capacitor, which improves visibility, and reduces an afterimage.

Additional aspects will be set forth in part in the detailed description which follows and, in part, will be apparent from the disclosure, or may be learned by practice of the inventive concept.

According to one or more exemplary embodiments, a liquid crystal display device includes a first substrate including an electrode structure layer defining a pixel and a switching device configured to switch the pixel, an opposite second substrate facing the first substrate and including a common electrode, and a liquid crystal layer disposed between the first and second substrates, in which the electrode structure layer includes a coupling electrode electrically connected to an output electrode of the switching device, a first pixel electrode electrically connected to the output electrode of the switching device, a second pixel electrode facing the coupling electrode and electrically floated with respect to the coupling electrode, and an insulating layer disposed between the coupling electrode and the second pixel electrode, and an absolute value difference between a first product $R_pC_p$ of a resistance $R_p$ and a capacitance $C_p$ defined by the coupling electrode, the insulating layer, and the second pixel electrode, and a second product $R_2C_2$ of a resistance $R_2$ and a capacitance $C_2$ defined by the second pixel electrode, the liquid crystal layer, and the common electrode is less than or equal to 10, as shown by the equation $|R_pC_p - R_2C_2| \leq 10$.

According to one or more exemplary embodiments, a method of manufacturing a liquid crystal display device includes forming a first substrate, including forming a coupling electrode electrically connected to an output electrode of a switching device on the first substrate, the switching device being configured to switch a pixel, forming an insulating layer to cover the coupling electrode and the switching device, forming a first pixel electrode passing through the insulating layer, the first pixel electrode being electrically connected to the output electrode of the switching device, and forming a second pixel electrode electrically insulated from the first pixel electrode, and forming a second substrate including a common electrode, and forming a liquid crystal layer between the first and second substrates, in which the insulating layer includes a material, such that an absolute value difference between a first product $R_pC_p$ of a resistance $R_p$ and a capacitance $C_p$ defined by the coupling electrode, the insulating layer, and the second pixel electrode, and a second product $R_2C_2$ of a resistance $R_2$ and a capacitance $C_2$ defined by the second pixel electrode, the liquid crystal layer, and the common electrode is less than or equal to 10, as shown by the equation $|R_pC_p - R_2C_2| \leq 10$.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
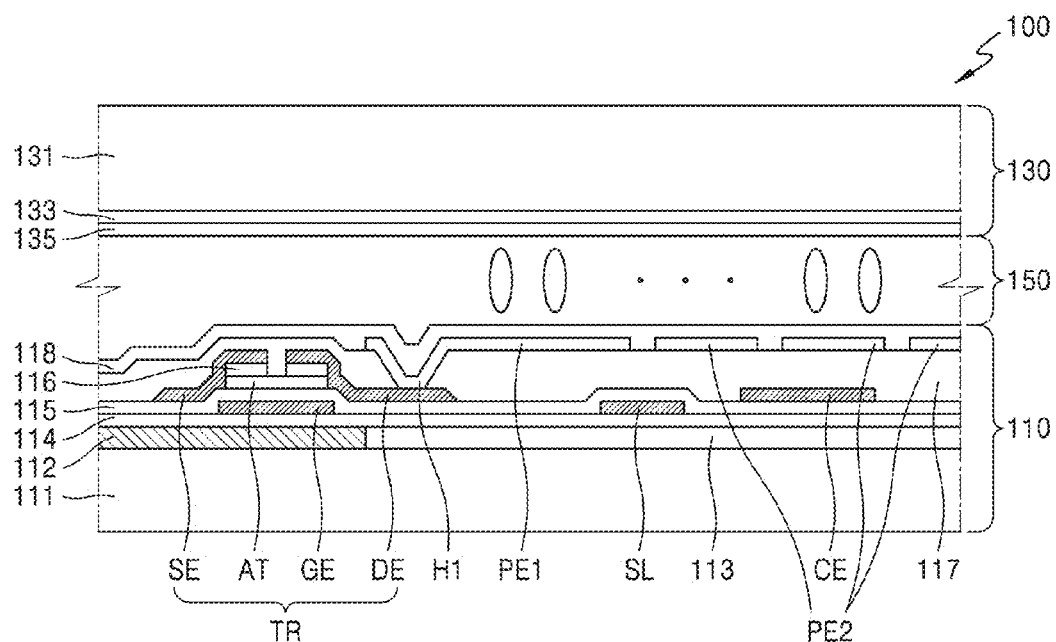
FIG. 1 is a cross-sectional view illustrating a structure of a liquid crystal display (LCD) device, according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
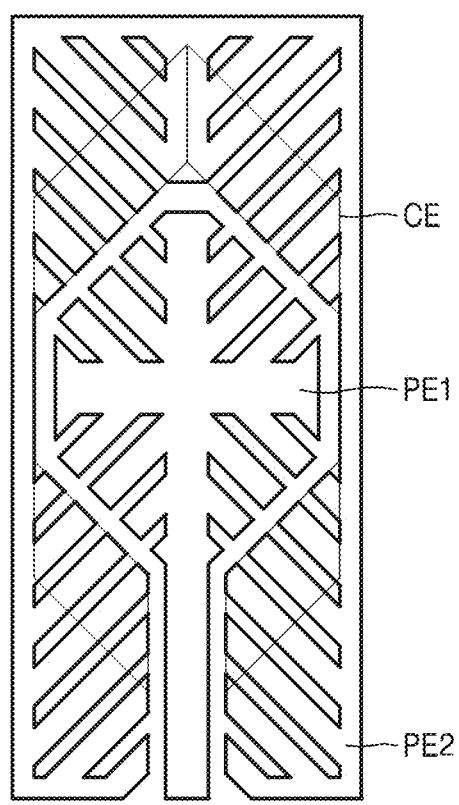
FIG. 2 is a plan view illustrating a first pixel electrode, a second pixel electrode, and a coupling electrode in an LCD device, according to an exemplary embodiment.
Figure 3:
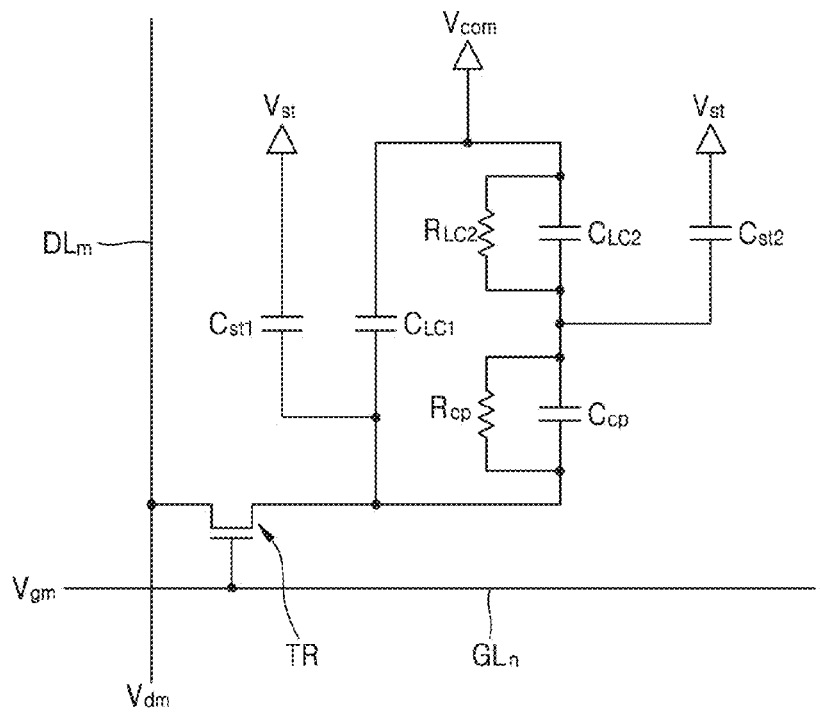
FIG. 3 is an equivalent circuit diagram illustrating one pixel in an LCD device, according to an exemplary embodiment.

FIG. 1 is a cross-sectional view illustrating a structure of an LCD device 100, according to an exemplary embodiment. FIG. 2 is a plan view illustrating a first pixel electrode, a second pixel electrode, and a coupling electrode in the LCD device 100, according to an exemplary embodiment. FIG. 3 is an equivalent circuit diagram illustrating one pixel in the LCD device 100, according to an exemplary embodiment.

Referring to FIGS. 1 and 2, the LCD device 100 includes an array substrate 110, an opposite substrate 130 facing the array substrate 110, and a liquid crystal (LC) layer 150 disposed between the array substrate 110 and the opposite substrate 130.

The array substrate 110 includes an electrode structure layer for forming a pixel, and a switching device TR configured to switch the pixel. The electrode structure layer includes electrode patterns that may form pixels arranged in a matrix form, and an insulating layer 117. For descriptive convenience, FIGS. 1 and 2 illustrate an electrode structure layer for one pixel, which may be an (n×m)-th pixel.

The switching device TR includes a gate electrode GE, a channel layer AT, a source electrode SE, and a drain electrode DE. The gate electrode GE branches off from a gate line (not shown), for example, an n-th gate line GLn (see FIG. 3), and receives an n-th gate signal. The source electrode SE branches off from a data line (not shown), for example, an m-th data line DLm (see FIG. 3), and receives an m-th data signal. The drain electrode DE outputs a data voltage in response to a gate signal.

The electrode structure layer includes a first pixel electrode PE1 electrically connected to the drain electrode DE, a coupling electrode CE electrically connected to the drain electrode DE, a second pixel electrode PE2 facing the coupling electrode CE, and the insulating layer 117 between the coupling electrode CE and the second pixel electrode PE2. The drain electrode DE may be an output electrode of the switching device TR, and the second pixel electrode PE2 may be electrically floated.

The array substrate 110 may be formed by forming a gate metallic layer on a first base substrate 111. A gate electrode GE and a storage line SL may be formed by patterning the gate metallic layer. The gate metallic layer may include material such as platinum (Pt), ruthenium (Ru), gold (Au), silver (Ag), molybdenum (Mo), aluminum (Al), tungsten (W), palladium (Pd), magnesium (Mg), nickel (Ni), iridium (Ir), chrome (Cr), calcium (Ca), titanium (Ti), or copper (Cu).

Next, a gate insulating layer 115 that covers the gate electrode GE and the storage line SL is deposited. The gate insulating layer 115 may include at least one of silicon oxide (SiOx), silicon nitride (SiNx), silicon oxynitride (SiON), aluminum oxide ($Al_2O_3$), titanium oxide ($TiO_2$), tantalum pentoxide ($Ta_2O_5$), hafnium oxide ($HfO_2$), zirconium oxide ($ZrO_2$), barium strontium titanate (BST), and lead zirconate titanate (PZT), and may include a single layer or multiple layers.

The channel layer AT is formed on a portion of the gate insulating layer 115 that corresponds to the gate electrode GE. The channel layer AT may include various kinds of semiconductor materials. For example, the channel layer AT may include an inorganic semiconductor material, such as amorphous silicon or crystalline silicon. Alternatively, the channel layer AT may include an oxide semiconductor or an organic material. An ohmic contact layer 116 may be formed on the channel layer AT.

A data metallic layer is disposed on the gate insulating layer 115, on which the channel layer AT is formed. The source electrode SE and the drain electrode DE spaced apart from each other above the upper portion of the channel layer AT are formed by patterning the data metallic layer. The coupling electrode CE extending from the drain electrode DE is formed by patterning the data metallic layer. The coupling electrode CE may include a transparent conductive material, such as indium tin oxide (ITO) or indium zinc oxide (IZO).

Next, the insulating layer 117 that covers the switching device TR and the coupling electrode CE is formed. The insulating layer 117 may include an inorganic material, for example, SiNx or SiOx. The insulating layer 117 may include at least one of $Al_2O_3$, $TiO_2$, $Ta_2O_5$, $HfO_2$, $ZrO_2$, BST, and PZT, and may include a single layer or multiple layers. Alternatively, the insulating layer 117 may include a polymer material.

The insulating layer 117 may be formed via chemical vapor deposition (CVD). A composition of the insulating layer 117 may be controlled by disposing the first base substrate 111, on which the switching device TR and the coupling electrode CE are formed, in a CVD chamber, and controlling a flux ratio of a gas injected to the CVD chamber. For example, when the insulating layer 117 includes SiNx, a content ratio of nitrogen to silicon may be adjusted by controlling a flux ratio of silane ($SiH_4$), nitrogen ($N_2$), and ammonia ($NH_3$).

The insulating layer 117 forms a coupling capacitor together with the coupling electrode CE and the second pixel electrode PE2. The insulating layer 117 may be formed to reduce a screen malfunction, such as an afterimage or flicker, which will be described in more detail below.

A contact hole H1 that exposes a portion of the drain electrode DE is formed in the insulating layer 117. A transparent conductive layer, such as ITO or IZO, is disposed on the insulating layer 117. The transparent conductive layer contacts the drain electrode DE via the contact hole H1. The first pixel electrode PE1 and the second pixel electrode PE2 electrically insulated from each other are formed by patterning the transparent conductive layer.

The first pixel electrode PE1 is electrically connected with the drain electrode DE via the contact hole H1 formed in the insulating layer 117. The second pixel electrode PE2 partially overlaps the coupling electrode CE with the insulating layer 117 disposed therebetween. Each of the first pixel electrode PE1 and the second pixel electrode PE2 partially overlaps the storage line SL. Accordingly, the second pixel electrode PE2, the insulating layer 117, and the coupling electrode CE form the coupling capacitor $C_{cp}$ and a coupling resistance $R_{CP}$, as illustrated in FIG. 3. A first storage capacitor $C_{st1}$ may be defined by the first pixel electrode PE1 and the storage line SL, and a second storage capacitor $C_{st2}$ may be defined by the second pixel electrode PE2 and the storage line SL.

Referring back to FIGS. 1 and 2, a first alignment layer 118 is formed on the insulating layer 117, on which the first and second pixel electrodes PE1 and PE2 are formed. The first alignment layer 118 may be a vertical alignment layer.

The array substrate 110 may also include a black matrix 112 and a color filter 113 formed on the first base substrate 111. The black matrix 112 may be formed on a non-effective display area, such as a portion of the first base substrate 111 that corresponds to the switching device TR. The color filter 113 may be formed on an effective display area, such as a portion of the first base substrate 111 that corresponds to the first and second pixel electrodes PE1 and PE2.

The opposite substrate 130 includes a second base substrate 131 facing the first base substrate 111, and a common electrode 133 disposed on the second base substrate 131. The common electrode 133 faces the first and second pixel electrodes PE1 and PE2 with the liquid crystal (LC) layer 150 disposed therebetween. Accordingly, referring to FIG. 3, a first LC capacitor $C_{LC1}$ is formed by the first pixel electrode PE1, the LC layer 150, and the common electrode 133. In addition, a second LC capacitor $C_{LC2}$ and a second LC resistor $R_{LC2}$ may be defined by the second pixel electrode PE2, the LC layer 150, and the common electrode 133, as illustrated in FIG. 3.

An opening pattern (not shown) may be formed on the common electrode 133, to divide a portion of the LC layer 150 that corresponds to the first pixel electrode PE1, and a portion of the LC layer 150 that corresponds to the second pixel electrode PE2, into multiple domains, respectively. A second alignment layer 135 is formed on the common electrode 133. The second alignment layer 135 may be a vertical alignment layer. LC molecules included in the LC layer 150 may be vertically aligned by the first and second vertical alignment layers 118 and 135.

The first pixel electrode PE1 is electrically connected with the drain electrode DE, which is an output electrode of the switching device TR, and receives a voltage therefrom. The second pixel electrode PE2 receives a divided output voltage of the switching device TR, by capacitances of the coupling capacitor $C_{cp}$ and the second LC capacitor $C_{CL2}$. As such, the first pixel electrode PE1 may be referred to as a main pixel electrode, and the second pixel electrode PE2 may be referred to as a sub-pixel electrode.

A ratio of a voltage of the second pixel electrode PE2 to a voltage of the first pixel electrode PE1, and a ratio of an area of the second pixel electrode PE2 to an area of the first pixel electrode PE1 may be determined in consideration of a visibility index and transmittance. For example, the ratio of the voltage of the second pixel electrode PE2 to the voltage of the first pixel electrode PE1 may be 1:0.7 to 0.8. The ratio of the area of the second pixel electrode PE2 to the area of the first pixel electrode PE1 may be 1:1.5 to 2.5.

Shapes of the first pixel electrode PE1, the second pixel electrode PE2, and the coupling electrode CE illustrated with respect to FIGS. 1 and 2 may be varied in consideration of the above-described area ratio. In addition, since the voltage ratio of the first pixel electrode PE1 and the second pixel electrode PE2 may be determined by the capacitance of the coupling capacitor $C_{cp}$, the area and the shape of the coupling electrode CE may be varied in consideration of the above-described voltage ratio.

Referring to FIG. 3, an (n×m)-th pixel is electrically connected to the n-th gate line GLn and the m-th data line DLm. According to the present exemplary embodiment, a switching device TR of the (n×m)-th pixel is electrically connected to the n-th gate line GLn and the m-th data line DLm. The switching device TR outputs an m-th data voltage Vdm applied to the m-th data line DLm, in response to an n-th gate voltage Vgn applied to the n-th gate line GLn.

The first LC capacitor $C_{LC1}$ and the first storage capacitor $C_{st1}$ are connected in parallel to a drain electrode of the switching device TR. The coupling capacitor $C_{cp}$ is electrically connected to the drain electrode and connected to the first LC capacitor $C_{LC1}$ in parallel. The second LC capacitor $C_{LC2}$ is connected with the coupling capacitor $C_{cp}$ in series and connected with the second storage capacitor $C_{st2}$ in parallel.

The m-th data voltage Vdm output from the drain electrode of the switching device TR is provided to the first pixel electrode PE1 (see FIG. 1), which may serve as an electrode of the first LC capacitor $C_{LC1}$ and the first storage capacitor $C_{st1}$, and the coupling electrode CE, which may serve as an electrode of the coupling capacitor $C_{cp}$.

A common voltage Vcom is applied to the common electrode 133 (see FIG. 1), which may serve as an electrode of the first and second LC capacitors $C_{LC1}$ and $C_{LC2}$. A storage voltage $V_{st}$ is applied to the storage line SL (see FIG. 1), which may serve as one electrode of the first and second storage capacitors $C_{st1}$ and $C_{st2}$. The storage voltage Vst may have the same voltage level as the common voltage Vcom. According to an exemplary embodiment, the storage voltage Vst and the common voltage Vcom may have a voltage level different from one another.

The first LC capacitor $C_{LC1}$ is charged with a voltage that may correspond to a voltage difference between the common voltage Vcom and the m-th data voltage Vdm. For instance, when the common voltage Vcom is 0V, the first LC capacitor $C_{LC1}$ may be charged with a voltage of the same level as that of the m-th data voltage Vdm.

The m-th data voltage Vdm is divided to the coupling capacitor $C_{cp}$ and the second LC capacitor $C_{LC2}$, in accordance with the corresponding capacitances of the coupling capacitor $C_{cp}$ and the second LC capacitor $C_{LC2}$. Accordingly, the second LC capacitor $C_{LC2}$ is charged with a voltage of the second pixel electrode PE2, which may have been voltage-dropped by the charge amount at the coupling capacitor $C_{cp}$. Accordingly, the second LC capacitor $C_{LC2}$ has a voltage level lower than the voltage of the first pixel electrode PE1.

As described above, electric fields of different magnitudes may be formed on regions of the LC layer 150 that correspond to the first pixel electrode PE1 and the second pixel electrode PE2, respectively. Accordingly, LC arrangements in the first pixel electrode PE1 and the second pixel electrode PE2 may be different from each other, thus transmittances thereof may be different. More particularly, when one pixel includes domains having different gray values from each other, a viewer of the LCD device 100 may recognize the different gray values as an intermediate gray value. Accordingly, a gamma curve may be distorted in a middle gray scale and below, which may improve lateral visibility of the LCD device 100.

The LCD device 100 according to the present exemplary embodiment may reduce an afterimage that may occur due to the coupling capacitor $C_{cp}$, by adjusting a resistance $R_p$ of the coupling resistor $R_{cp}$ and a capacitance $C_p$ of the coupling capacitor $C_{cp}$, which may be formed between the coupling electrode CE and the second pixel electrode PE2. More particularly, a value of the product of the resistance $R_p$ and the capacitance $C_p$ ($R_p C_p$) of the LCD device 100 may adjusted. The value of the product $R_p C_p$ may be irrelevant to the shapes of the coupling electrode CE and the second pixel electrode PE2, and may correspond to the product of a specific resistance and a dielectric constant of the insulating layer 117 between the two electrodes.

According to the present exemplary embodiment, when the value of the product $R_pC_p$ may be similar to the product of a resistance $R_2$ and a capacitance $C_2$ formed between the common electrode 133 and the second pixel electrode PE2 ($R_2C_2$), the LCD device 100 may reduce an afterimage formed thereon, which will be further described with reference to various analyses described below.

In the LCD device 100 according to the present exemplary embodiment, the material of the insulating layer 117 may satisfy Equation 1.

$$|R_pC_p - R_2C_2| \leq 10 \qquad \text{Eq. 1}$$

The product of a resistance and a capacitance may be associated with a physical property of the material disposed between electrodes, rather than the shape of the electrodes. The product of the resistance and the capacitance may be derived from the product of a resistivity and a dielectric constant of the material disposed between the electrodes, which may have a unit of seconds (sec). Hereinafter, the product $R_2C_2$ associated with the physical property of the LC layer 150 may be referred to as RC, for convenience of description. An RC value formed by the LC layer 150 may be about 33, and the material of the insulating layer 117 may be selected based on the RC value. For example, when the insulating layer 117 includes a SiNx layer, a desired $R_pC_p$ may be obtained by adjusting a ratio of nitrogen (N) and silicon (Si).

In the LCD device 100 according to the present exemplary embodiment, the material of the insulating layer 117 may be determined, such that the coupling capacitor may satisfy Equation 2.

$$30 \leq R_pC_p \leq 40 \qquad \text{Eq. 2}$$

Figure 4:
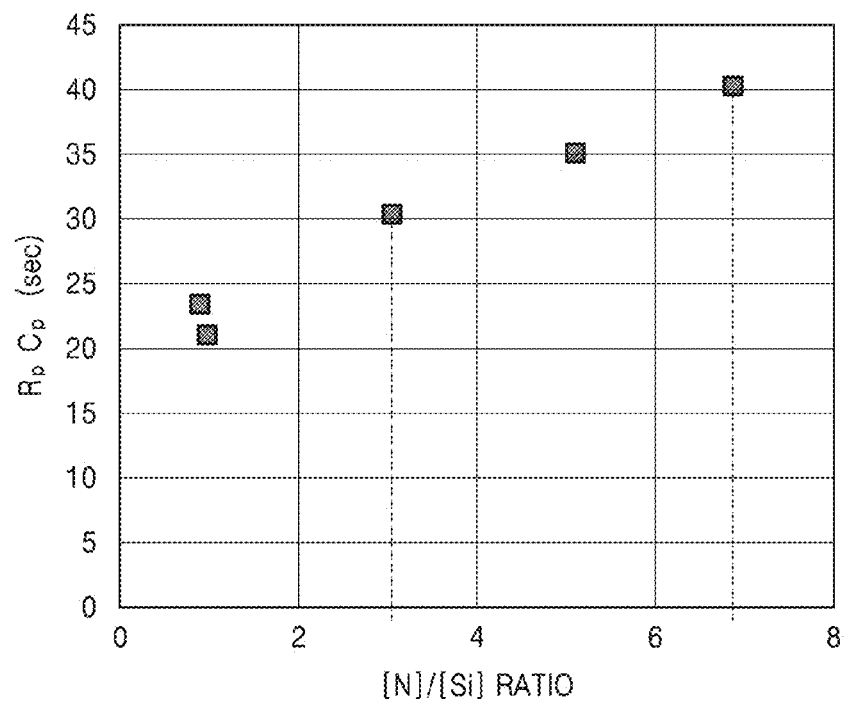
FIG. 4 is a graph illustrating the product of a resistance and a capacitance formed by a second pixel electrode, an insulating layer, and a coupling electrode, according to a ratio of N and Si of the insulating layer in an LCD device, according to an exemplary embodiment.

FIG. 4 is a graph illustrating the product of a resistance and a capacitance $R_pC_p$ formed by the second pixel electrode PE2, the insulating layer 117, and the coupling electrode CE, according to a ratio of N and Si of SiNx forming the insulating layer 117 in the LCD device 100, according to the exemplary embodiment described above with respect to FIGS. 1 to 3.

Referring to the graph of FIG. 4, the value of $R_pC_p$ increases as N content in N/Si ratio increases. Accordingly, in order to for the value of the product $R_pC_p$ to be similar to RC of the LC layer 150, which may be in a range of about 30 to about 40, a content ratio of N to Si may be in a range of about 3 to about 7. The content ratio of N to Si in the insulating layer 117 may be adjusted during a manufacturing process.

Figure 5:
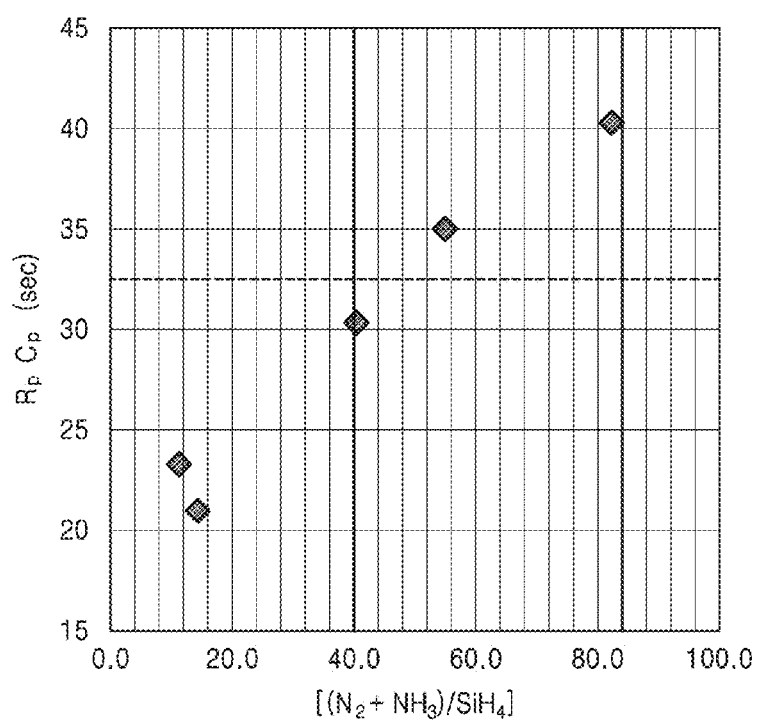
FIG. 5 is a graph illustrating the product of a resistance and a capacitance formed by a second pixel electrode, an insulating layer, and a coupling electrode, according to a flux ratio of $N_2$, $NH_3$, and $SiH_4$, when the insulating layer is manufactured by using chemical vapor deposition in an LCD device, according to an exemplary embodiment.

FIG. 5 is a graph illustrating the product of a resistance and a capacitance $R_pC_p$ formed by the second pixel electrode PE2, the insulating layer 117, and the coupling electrode CE, according to a flux ratio of $N_2+NH_3$ to $SiH_4$, when the insulating layer 117 is manufactured by using CVD in the LCD device 100, according to the exemplary embodiment described above with respect to FIGS. 1 to 3.

A value of $R_pC_p$ may be controlled by adjusting a flux ratio of $N_2+NH_3$ to $SiH_4$. For example, when SiNx is manufactured by using CVD, a flux ratio of $N_2+NH_3$ to $SiH_4$ may set to be in a range of about 40 to about 84, such that the value of $R_pC_p$ may be in a range of about 30 and about 40, as similar to RC of the LC layer 150.

Hereinafter, experimental results of the LCD device 100 including the insulating layer 117, which may reduce an afterimage thereon, will be further described below.

Figure 6:
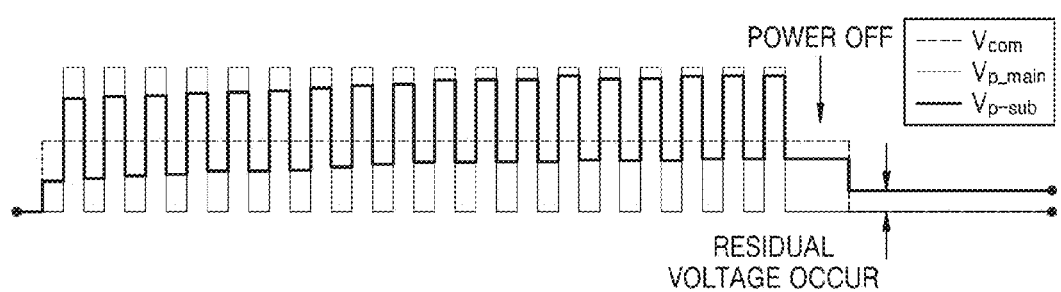
FIG. 6 is a voltage signal graph of a first pixel electrode, a second pixel electrode, and a common electrode, conceptually illustrating a principle of an afterimage generation when voltages are divided to the two pixel electrodes by using a coupling capacitor method.

FIG. 6 is a voltage signal graph of a first pixel electrode, a second pixel electrode, and a common electrode, conceptually illustrating a principle of an afterimage generation, when voltages are divided to the two pixel electrodes by using a coupling capacitor method.

Referring to FIG. 6, a voltage $V_{p\_main}$ having an inverted polarity with respect to the common voltage $V_{com}$ is applied to the first pixel electrode on a frame basis. A voltage $V_{p\_sub}$, of which a magnitude thereof corresponds to a divided voltage $V_{p\_main}$ by the coupling capacitor $C_{cp}$, may be applied to the second pixel electrode. The sub-pixel voltage $V_{p\_sub}$ may not be symmetric with respect to the common voltage $V_{com}$ and may gradually shift to one direction with passage of time. This phenomenon may cause flicker on a screen during a pixel-on state. After a pixel is turned off, that is, even after a voltage applied to the first pixel electrode (e.g., a main pixel electrode) disappears, a residual voltage may occur at the second pixel electrode (e.g., a sub-pixel electrode), which may induce an afterimage.

Various factors have been suggested as a cause for a sub-pixel voltage $V_{p\_sub}$, which may induce flicker and an afterimage on a screen. For example, one analysis suggests that the sub-pixel voltage $V_{p\_sub}$ is caused because the resistance of the LC layer differs depending on the polarity of voltages formed at both ends of the LC layer. Other analysis suggests that the sub-pixel voltage $V_{p\_sub}$ occurs due to the second pixel electrode being electrically floated.

Figure 7A:
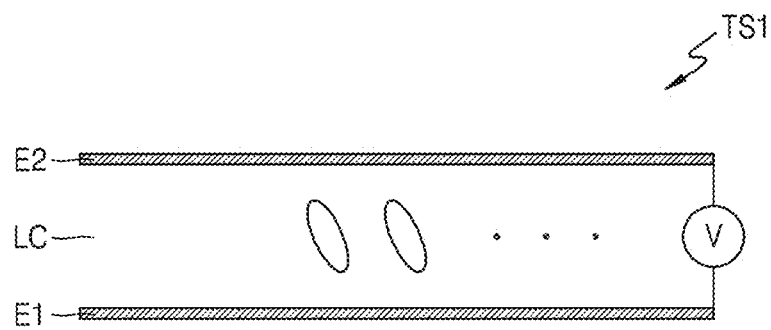
FIGS. 7A, 7B, and 7C are cross-sectional views illustrating a structure of test samples for analyzing a cause that induces an afterimage.
Figure 7B:
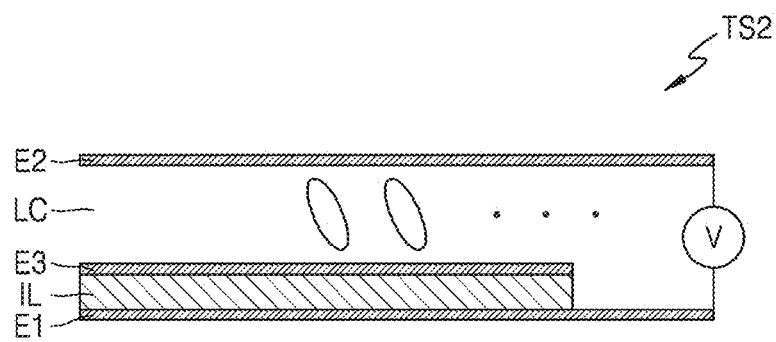
Figure 7C:
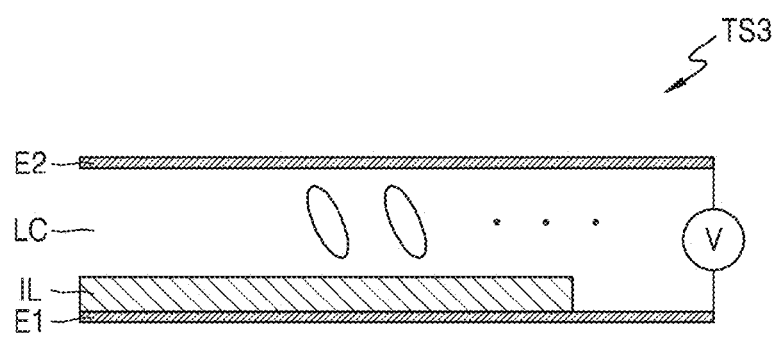
Figure 8A:
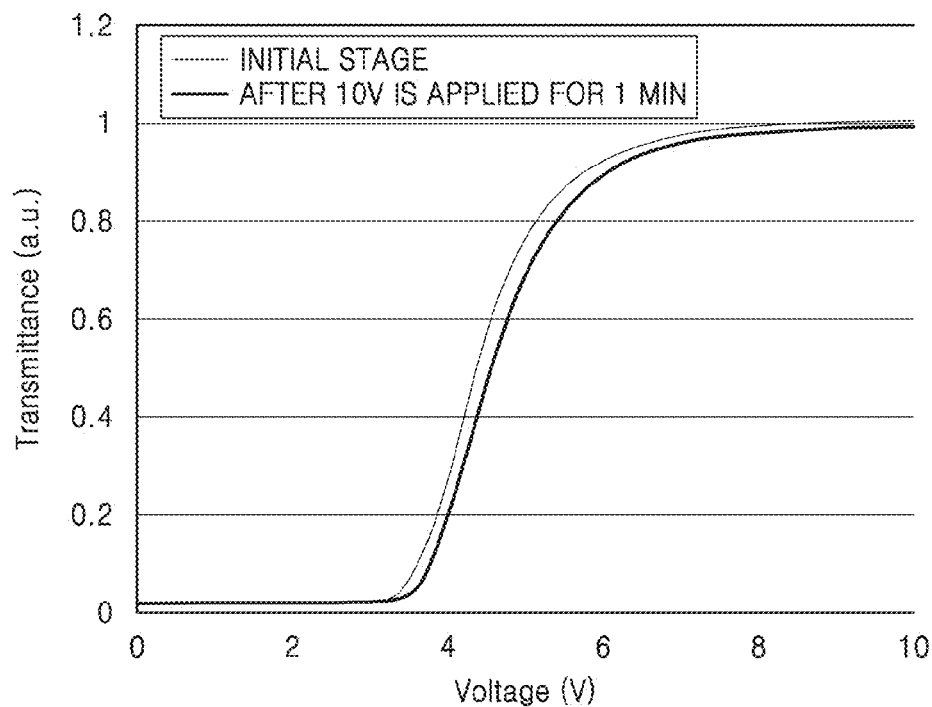
FIGS. 8A, 8B, and 8C are graphs illustrating a voltage-transmittance hysteresis curve for the test samples of FIGS. 7A, 7B, and 7C, respectively.
Figure 8B:
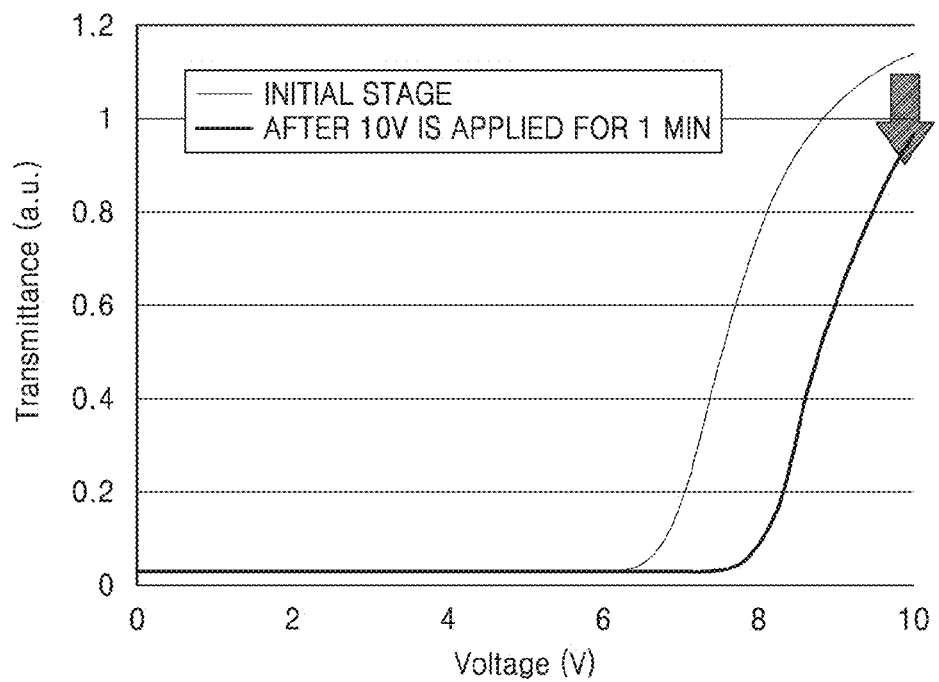
Figure 8C:
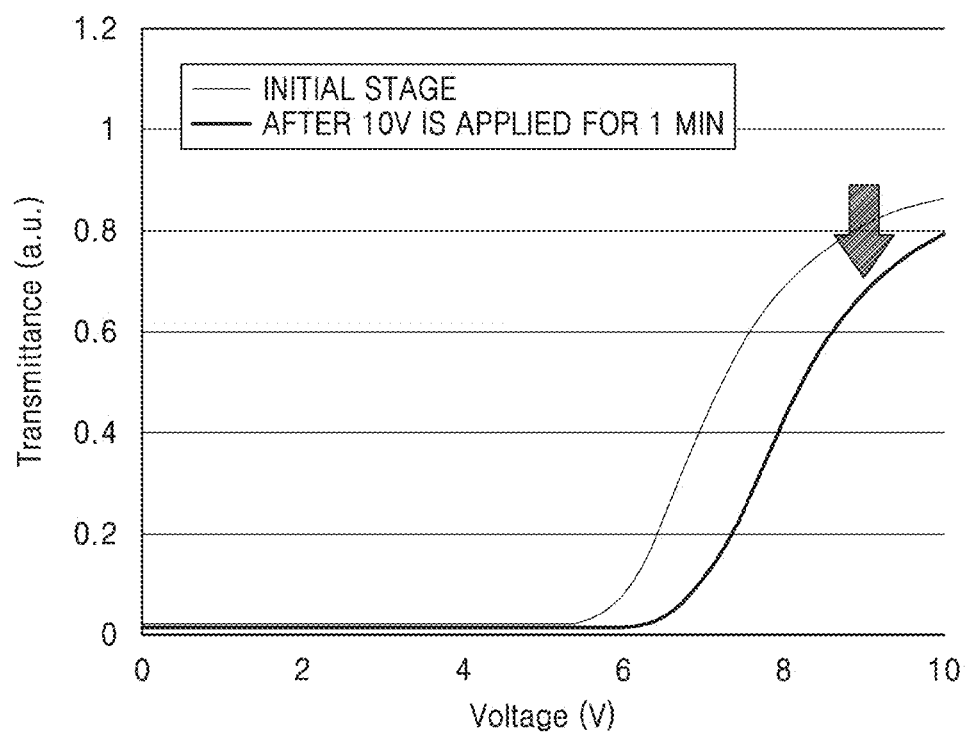

FIGS. 7A, 7B, and 7C are cross-sectional views illustrating a structure of test samples for analyzing a cause that induces an afterimage. FIGS. 8A, 8B, and 8C are graphs illustrating a voltage-transmittance (V-T) hysteresis curve for the test samples of FIGS. 7A, 7B, and 7C, respectively.

A first test sample TS1 of FIG. 7A has a structure, in which an LC layer is disposed between two electrodes E1 and E2. A second test sample TS2 of FIG. 7B has a structure, in which an LC layer is disposed between two electrodes E1 and E2, and an insulating layer IL and a floating electrode E3 are formed on the electrode E1. A third test sample TS3 of FIG. 7C has the same structure as the second test sample of FIG. 7B, except that the floating electrode is removed.

A residual voltage, which may cause an afterimage as described with respect to FIG. 6, may be illustrated as a change in a V-T hysteresis curve. As such, to analyze the residual voltage, an initial V-T curve is obtained, and a V-T curve is measured again after applying a voltage of 10V for one minute.

Referring to FIG. 8A, in the first test sample TS1, in which only the LC layer is disposed between the two electrodes, the V-T curve nearly does not change, and hysteresis nearly does not appear. In contrast, referring to FIGS. 8B and 8C, hysteresis appear in a similar shape. According to the above results, hysteresis may be generated by the insulating layer IL and the existence of the floating electrode E3 may not be relevant to the hysteresis.

Figure 9A:
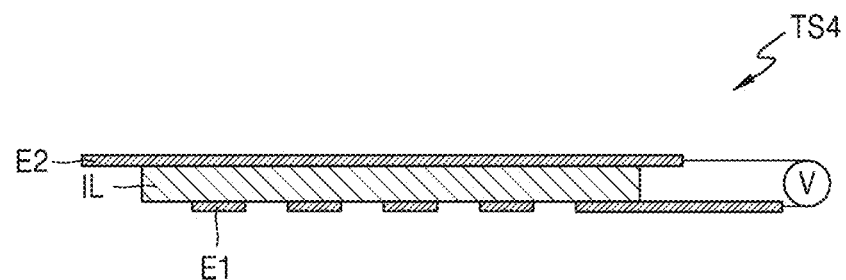
FIGS. 9A and 9B are cross-sectional views illustrating test samples for analyzing an influence of DC stress on a capacitance depending on the shape of a capacitor.
Figure 9B:
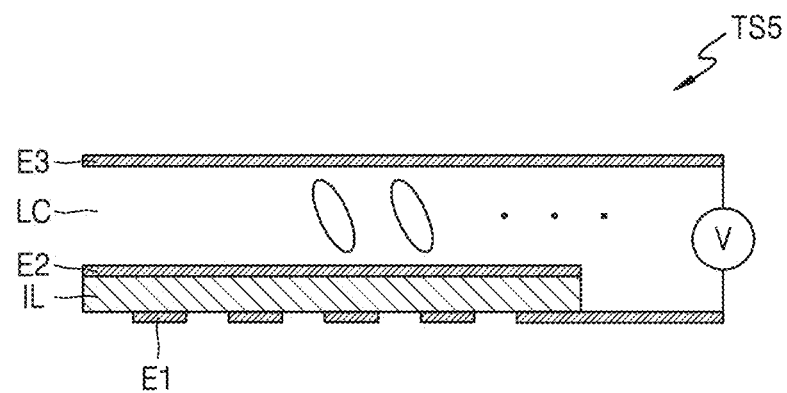
Figure 10A:
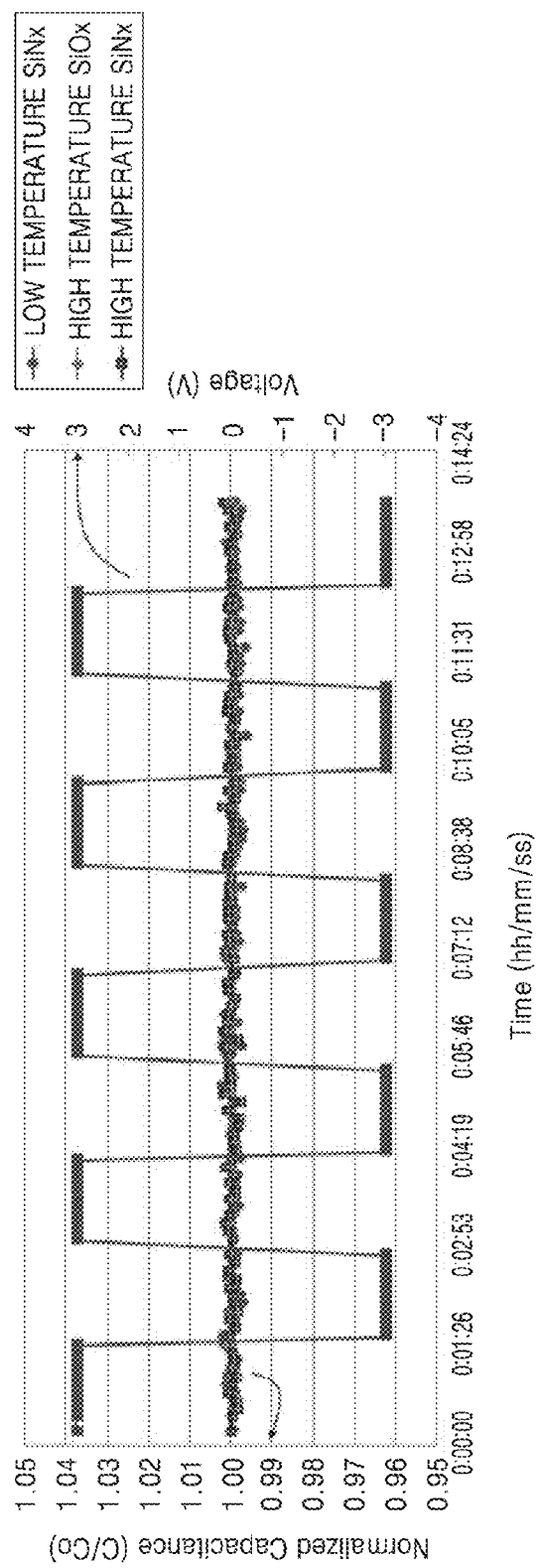
FIGS. 10A and 10B are graphs illustrating a change of capacitance under DC stress, according to a forming condition of an insulating layer in the test samples of FIGS. 9A and 9B.
Figure 10B:
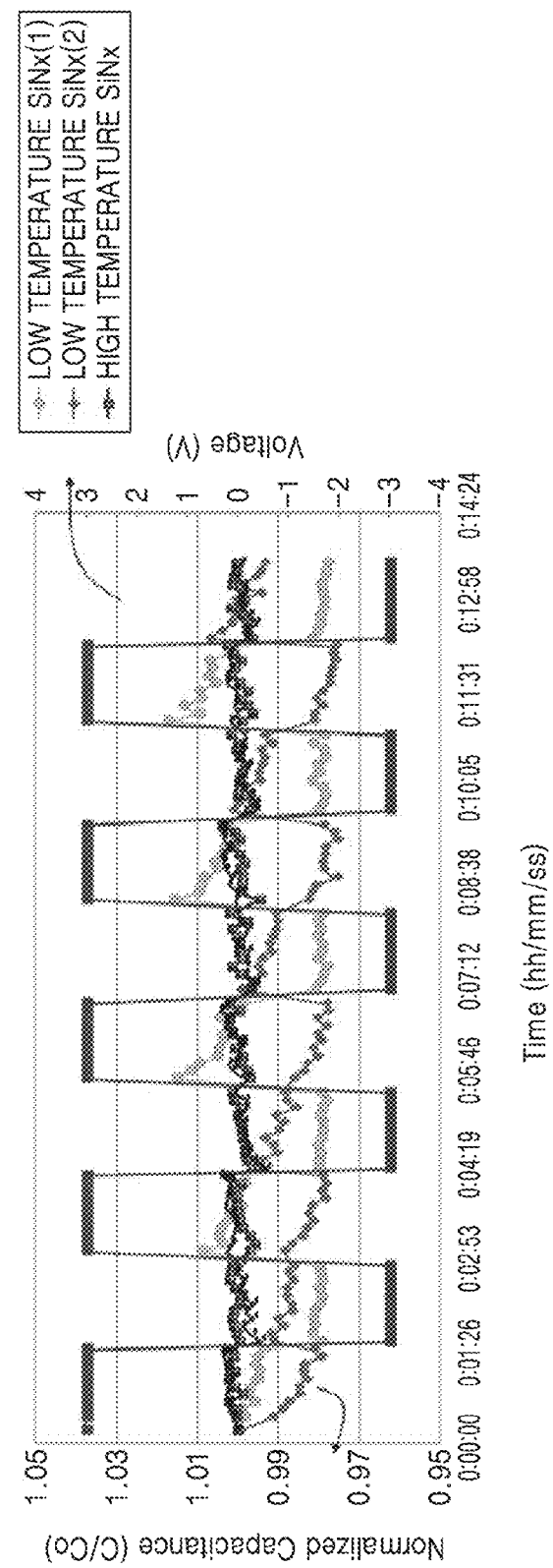

FIGS. 9A and 9B are cross-sectional views illustrating test samples for analyzing an influence of direct current (DC) stress on a capacitance, according to the shape of a capacitor. FIGS. 10A and 10B are graphs illustrating a change of capacitance under DC stress, according to a forming condition of an insulating layer formed on the test samples of FIGS. 9A and 9B, respectively.

A fourth test sample TS4 of FIG. 9A may be a capacitor, in which an insulating layer IL is disposed between two electrodes E1 and E2. A fifth test sample TS5 of FIG. 9B has a configuration, in which a capacitor having an insulating layer IL between two electrodes E1 and E2 is connected in series with a capacitor having an LC layer between two electrodes E2 and E3.

FIG. 10A illustrates a capacitance measured from the fourth test sample TS4 of FIG. 9A, while applying 3 V to the fourth test sample TS4 for one minute, applying −3 V to the fourth test sample TS4 for one minute, and repeating the cycle of applying 3 V and −3V for five times. For a material of the insulating layer IL, SiNx manufactured under a high temperature condition, SiNx manufactured under a low temperature condition, and SiOx manufactured under a high temperature condition were used. In the graph of FIG. 10A, a horizontal axis plots time of DC stress applied, and a vertical axis plots a normalized capacitance (i.e., ratio of a capacitance C measured under DC stress to a capacitance $C_0$ before the stress is applied).

Referring to the graph of FIG. 10A, the capacitance C measured under the DC stress is nearly the same as the capacitance $C_0$ before the stress is applied, as the normalized capacitance $C/C_0$ is substantially maintained at 1. The capacitance C does not change even when the DC stress cycle continues, for each of the fourth test samples TS4 formed in three different conditions (i.e., SiNx manufactured under a high temperature condition, SiNx manufactured under a low temperature condition, and SiOx manufactured under a high temperature condition).

FIG. 10B illustrates a capacitance measured from the fifth test sample TS5 of FIG. 9B, while applying 3 V to the fifth test sample TS5 for one minute, applying −3 V to the fifth test sample TS5 for one minute, and repeating the cycle of applying 3 V and −3V for five times. For a material of the insulating layer IL, SiNx manufactured under a high temperature condition, and two kinds of SiNx manufactured under a low temperature condition were used. Referring to the graph of FIG. 10B, a change in capacitance under the DC stress is larger in the fifth test sample TS5, as compared to that of the fourth test sample TS4 illustrated in FIG. 10A. In addition, a magnitude of the change increases as the stress cycle continues. Further, the shape the capacitance change for each of the fifth test samples TS5 formed in three different conditions are different from one another. Accordingly, from the above results of FIGS. 10A and 10B, the LC layer and the material of the insulating layer may be in mutual relation with an afterimage generation.

To examine the mutual relation in more detail, the material of the insulating layer IL is diversified with respect to the fifth test sample TS5, and a residual voltage has been analyzed as follows. FIGS. 11A, 11B, 12A, and 12B are graphs explaining a flicker elimination method that may infer a residual voltage, as illustrated with reference to FIG. 6.

Figure 11A:
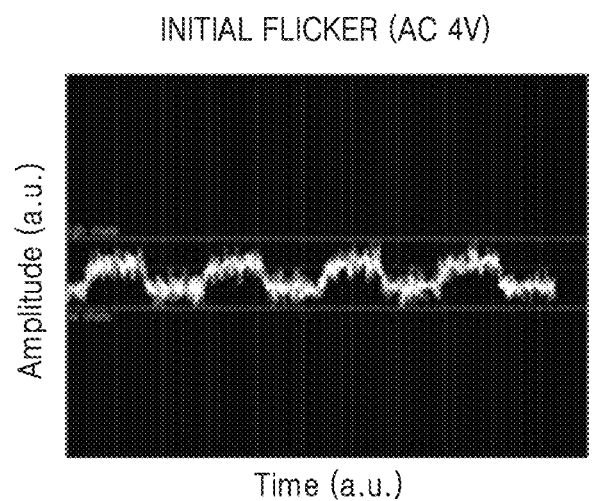
FIGS. 11A, 11B, 12A, and 12B are graphs illustrating a flicker elimination method that may infer a residual voltage of FIG. 6.
Figure 11B:
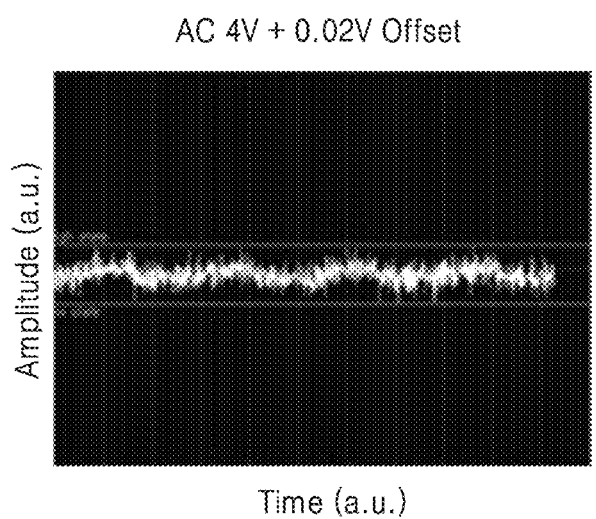

FIG. 11A illustrates flicker that occurs after AC 4 V of 2 Hz is applied. Referring back to FIG. 6, as flicker occurs while a voltage applied to the second pixel electrode shifts in one direction with respect to a voltage applied to a common electrode, the flicker may be eliminated by using an offset voltage that may offset the shifted voltage. Referring to FIG. 11B, flicker of an initial state (i.e., applied with AC 4 V of 2 Hz) may be reduced by applying an offset voltage of 0.02 V.

Figure 12A:
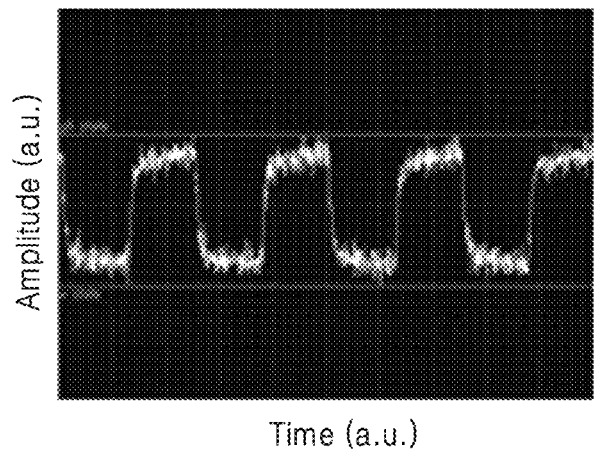
Figure 12B:
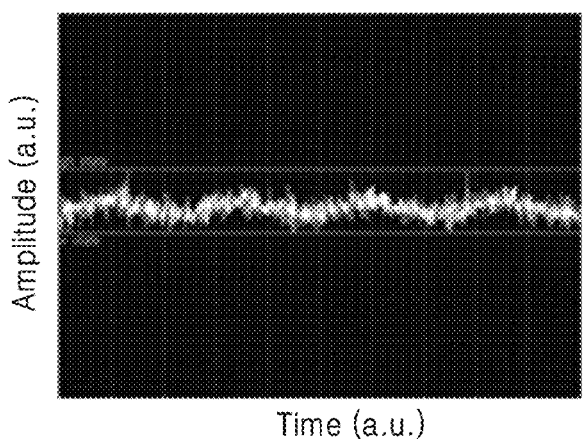

FIG. 12A illustrates flicker after AC 4 V of 2 Hz is applied for two hours. As compared to the case of FIG. 11A, a degree of the flicker may become severe. Referring to FIG. 12B, an offset voltage of 0.1 V is used to reduce the flicker, of which a magnitude of the offset voltage may be greater than the magnitude of the offset voltage (e.g., 0.02 V) used to eliminate the flicker of the initial state. More particularly, a magnitude of an offset voltage required to eliminate the flicker of the initial state may be different from a magnitude of an offset voltage required to eliminate the flicker after a voltage is applied for two hours. Accordingly, a residual voltage may be inferred from the difference in the offset voltages.

Figure 13:
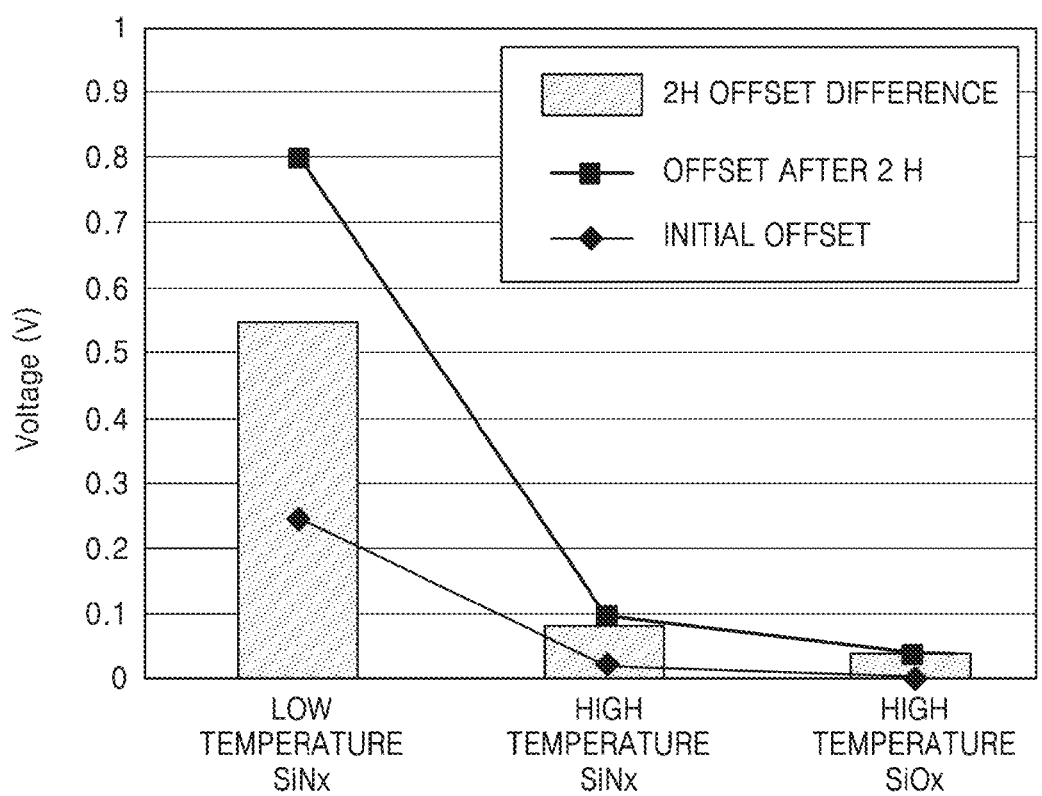
FIG. 13 is a graph comparing residual voltages inferred by a flicker elimination method according to a forming condition of an insulating layer.

FIG. 13 is a graph comparing residual voltages inferred by a flicker elimination method, according to a forming condition of an insulating layer.

Referring to the graph, the magnitude of an initial offset voltage is the largest when the insulating layer includes SiNx formed under a low temperature condition, the second largest when the insulating layer includes SiNx formed under a high temperature condition, and the smallest when the insulating layer includes SiOx formed under a high temperature condition. The magnitude of an initial offset voltage after a voltage is applied for two hours is the largest when the insulating layer includes SiNx formed under a low temperature condition, the second largest when the insulating layer includes SiNx formed under a high temperature condition, and the smallest when the insulating layer includes SiOx formed under a high temperature condition. A difference in an offset voltage, which may be inferred as a value corresponding to a residual voltage, is the largest when the insulating layer includes SiNx formed under a low temperature condition, the second largest when the insulating layer includes SiNx formed under a high temperature condition, and the smallest when the insulating layer includes SiOx formed under a high temperature condition.

Accordingly, a magnitude of an offset voltage for eliminating flicker may depend on materials used to form an insulation layer, such as SiNx and SiOx. When SiNx and SiOx are formed by using CVD, contents of each component therein may be controlled by controlling a deposition temperature. In addition, a residual voltage of a sub-pixel (which may be generated when a main pixel is turned off) may be different, depending on materials used to form an insulation layer, thus a degree of an afterimage may be different depending on the material of the insulating layer.

As described with reference to FIGS. 9A to 10B, when a capacitor includes only the insulating layer, a capacitance may not change from applied stress. When a serial capacitor includes the LC layer and the insulating layer together, a capacitance thereof may change in a greater degree from to the applied stress. As described with reference to FIGS. 11A to 13, when the serial capacitor includes the LC layer and the insulating layer together, a residual voltage of a floating electrode may be large, depending on the material of the insulating layer.

From the above results, values of resistance and capacitance of an LC capacitor, and values of resistance and capacitance of a coupling capacitor may affect characteristics of an afterimage.

Table 1 shows results of analyzing an offset voltage by a flicker elimination method with respect to various values of $R_pC_p$ (sec) of a coupling capacitor, which may depend on the material of an insulating layer, when RC of an LC is 33.

TABLE 1

| Case # | LC capacitor RC (sec) | Coupling capacitor $R_pC_p$ (sec) | Offset voltage (V) |
|---|---|---|---|
| 1 | 33 | 23 | 1.1 |
| 2 | 33 | 30 | 0.4 |

TABLE 1-continued

| Case # | LC capacitor RC (sec) | Coupling capacitor $R_pC_p$ (sec) | Offset voltage (V) |
|---|---|---|---|
| 3 | 33 | 35 | 0.1 |
| 4 | 33 | 40 | 0.2 |

Referring to Table 1, when $R_pC_p$ of the coupling capacitor approaches RC of the LC capacitor, an offset voltage required for eliminating flicker may reduced. From the above results, as illustrated with various analyses described above, it is shown that an afterimage may be induced by a mutual relation between an LC and the material of an insulating layer, when an LC capacitor is connected in series with a coupling capacitor.

According to exemplary embodiments, a display device may include a coupling capacitor that may improve lateral visibility and produce an image of high quality almost without flicker or an afterimage.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A liquid crystal display device, comprising:
a first substrate comprising an electrode structure layer defining a pixel and a switching device configured to switch the pixel;
an opposite second substrate facing the first substrate and comprising a common electrode; and
a liquid crystal layer disposed between the first and second substrates,
wherein:
the electrode structure layer comprises:
a coupling electrode electrically connected to an output electrode of the switching device different from the coupling electrode;
a first pixel electrode electrically connected to the output electrode of the switching device;
a second pixel electrode facing the coupling electrode and electrically floated with respect to the coupling electrode; and
an insulating layer disposed between the coupling electrode and the second pixel electrode; and
an absolute value difference between a first product $R_pC_p$ of a resistance $R_p$ and a capacitance $C_p$ defined by the coupling electrode, the insulating layer, and the second pixel electrode, and a second product $R_2C_2$ of a resistance $R_2$ and a capacitance $C_2$ defined by the second pixel electrode, the liquid crystal layer, and the common electrode is less than or equal to 10, as shown by the equation:

$$|R_pC_p - R_2C_2| \leq 10.$$

2. The liquid crystal display device of claim 1, wherein an absolute value of the first product $R_pC_p$ is in a range of equal to or greater than 30 and less than or equal to 40, as shown by the equation:

$$30 \leq R_pC_p \leq 40.$$

3. The liquid crystal display device of claim 1, wherein the insulating layer comprises at least one of silicon nitride (SiNx), silicon oxide (SiOx), aluminum oxide ($Al_2O_3$), titanium oxide ($TiO_2$), tantalum pentoxide ($Ta_2O_5$), hafnium oxide ($HfO_2$), zirconium oxide ($ZrO_2$), barium strontium titanate (BST), lead zirconate titanate (PZT), and a polymer material.

4. The liquid crystal display device of claim 1, wherein:
the insulating layer comprises silicon nitride; and
a ratio of nitrogen content to silicon content in the silicon nitride is in a range of 3 to 7.

5. The liquid crystal display device of claim 1, wherein a ratio of an area of the second pixel electrode to an area of the first pixel electrode is in a range of 1:1.5 to 2.5.

6. The liquid crystal display device of claim 1, wherein the capacitance $C_p$ defined by the coupling electrode, the insulating layer, and the second pixel electrode is determined, such that a voltage ratio of the first pixel electrode to the second pixel electrode is in a range of 1:0.7 to 0.8.

7. The liquid crystal display device of claim 1, wherein the first pixel electrode, the second pixel electrode, and the coupling electrode comprise a transparent conductive material.

8. The liquid crystal display device of claim 1, wherein:
the liquid crystal layer comprises a first region facing the first pixel electrode and a second region facing the second pixel electrode; and
the common electrode comprises an opening pattern dividing each of the first region and the second region into domains.

9. The liquid crystal display device of claim 1, wherein the first substrate further comprises a color filter.

* * * * *